(12) United States Patent
Xie et al.

(10) Patent No.: US 8,198,699 B1
(45) Date of Patent: Jun. 12, 2012

(54) INTEGRATED CIRCUIT PACKAGE WITH NON-SOLDER MASK DEFINED LIKE PADS

(75) Inventors: Yuanlin Xie, Fremont, CA (US); Yuan Li, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 164 days.

(21) Appl. No.: 12/762,958

(22) Filed: Apr. 19, 2010

(51) Int. Cl.
*H01L 21/70* (2006.01)
(52) U.S. Cl. ............. 257/499; 257/E21.17; 257/E23.02
(58) Field of Classification Search .................. 257/532, 257/737, 499, E21.17, E23.02; 438/612, 438/613, 614
See application file for complete search history.

(56) References Cited

U.S. PATENT DOCUMENTS

| | | | |
|---|---|---|---|
| 6,462,414 B1 | 10/2002 | Anderson | |
| 6,512,389 B1 * | 1/2003 | Kocher | 324/750.26 |
| 6,929,978 B2 | 8/2005 | Anderson | |
| 7,105,433 B2 * | 9/2006 | Tsai et al. | 438/613 |
| 2002/0155637 A1 * | 10/2002 | Lee | 438/108 |
| 2004/0134974 A1 * | 7/2004 | Oh et al. | 228/245 |

* cited by examiner

*Primary Examiner* — A. Sefer
*Assistant Examiner* — Nikolay Yushin
(74) *Attorney, Agent, or Firm* — Mauriel Kapouylian & Treffert LLP; Ararat Kapouytian

(57) ABSTRACT

Provided is an IC package. In one implementation, the IC package includes a metal pad having a first metal pad surface and a second metal pad surface substantially parallel to the first metal pad surface; a first dielectric layer having a first surface, a second surface, and a third surface, where the first dielectric layer covers a first end portion of the second metal pad surface, and the third surface of the first dielectric layer is substantially parallel to the first and second surfaces of the first dielectric layer; a second dielectric layer having a first surface, a second surface, and a third surface, where the second dielectric layer covers a second end portion of the second metal pad surface, and the third surface of the second dielectric layer is substantially parallel to the first and second surfaces of the second dielectric layer; and a metal structure covering a middle portion of the second metal pad surface, a first end portion of the third surface of the first dielectric layer, and a first end portion of the third surface of the second dielectric layer.

17 Claims, 5 Drawing Sheets

400

INTEGRATED CIRCUIT PACKAGE WITH NON-SOLDER MASK DEFINED LIKE PADS

BACKGROUND

This invention relates generally to integrated circuit (IC) packages.

In ball grid array (BGA) IC packages, there are generally two types of pads to which a BGA ball is electrically coupled, non-solder mask defined (NSMD) pads and solder mask defined (SMD) pads. Some of the main disadvantages of NSMD pads are pad lifting and poor routing capability. Due to their smaller metal pad size, SMD pads provide finer routing capability than NSMD pads. Additionally, SMD pads are not subject (or are less susceptible) to pad lifting as the end portions of their metal pads are covered by dielectric layers. However, SMD pads have worse solder joint reliability (SJR) than NSMD pads. The SJR worsens as the substrate thickness of the IC package is reduced. With sufficient thinning of the core substrate, an SMD pad may fail to meet SJR specifications. For example, it appears that SMD pads may not meet SJR specifications if used with 400 micrometer core substrates. Similarly, core-less IC packages similarly suffer from low SJR.

SUMMARY

Embodiments of the present invention are directed to providing NSMD-like pads that improve SJR reliability while maintaining some of the benefits of using SMD pads. In one embodiment of the present invention, an IC package is provided. The IC package includes: a metal pad having a first metal pad surface and a second metal pad surface substantially parallel to the first metal pad surface; a first dielectric layer having a first surface, a second surface, and a third surface, wherein the first dielectric layer covers a first end portion of the second metal pad surface, and the third surface of the first dielectric layer is substantially parallel to the first and second surfaces of the first dielectric layer; a second dielectric layer having a first surface, a second surface, and a third surface, wherein the second dielectric layer covers a second end portion of the second metal pad surface, and the third surface of the second dielectric layer is substantially parallel to the first and second surfaces of the second dielectric layer; and a metal structure covering a middle portion of the second metal pad surface, a first end portion of the third surface of the first dielectric layer, and a first end portion of the third surface of the second dielectric layer.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
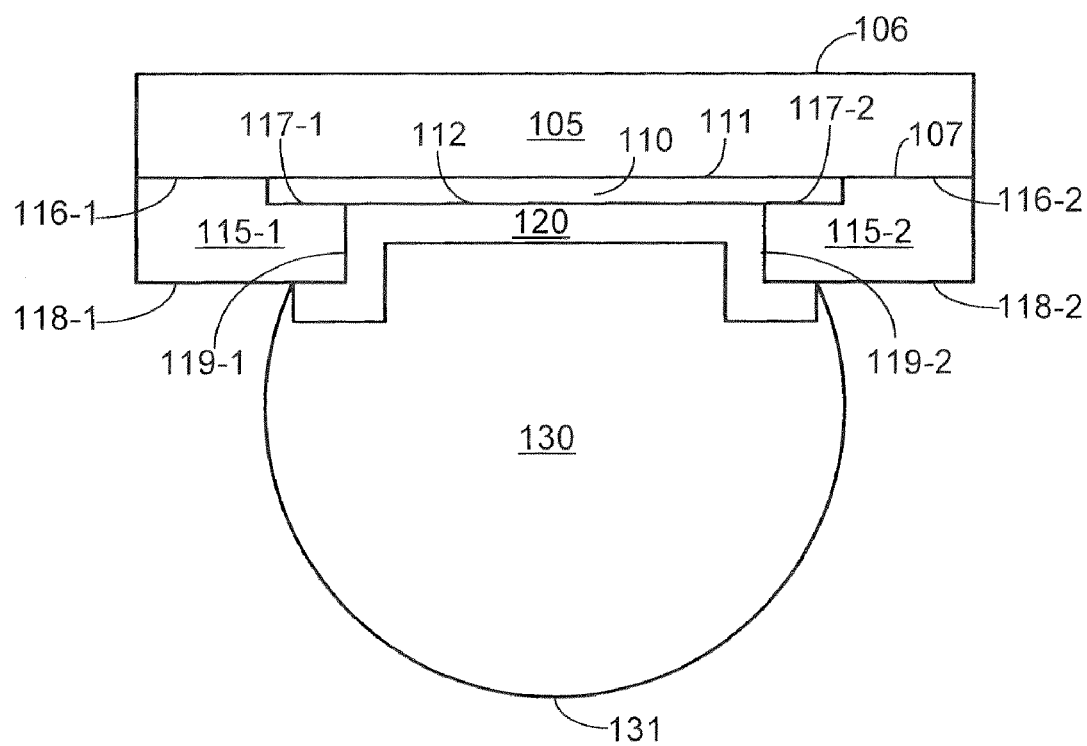
FIG. 1 shows a cross-sectional view of a first embodiment of an NSMD-like pad of the present invention.

FIG. 1 shows a cross-sectional view of a first embodiment of an NSMD-like pad of the present invention. In FIG. 1, NSMD-like pad 100 includes substrate layer 105, metal pad 110, dielectric layers 115-1 and 115-2, metal structure 120, and solder ball 130. Substrate layer 105 has a first surface 106 and a second surface 107. Similarly, metal pad 110 has a first surface 111 and a second surface 112. As can be seen in FIG. 1, first surface 111 is parallel to second surface 112. As used herein parallel is intended to encompass substantially parallel. As such, parallel and substantially parallel may herein be used interchangeably. Dielectric layer 115-1 has a first surface 116-1, a second surface 117-1, a third surface 118-1, and a vertical surface 119-1. As can be seen in FIG. 1, first surface 116-1, second surface 117-1, and third surface 118-1 are parallel to each other. Similarly, dielectric layer 115-2 has a first surface 116-2, a second surface 117-2, a third surface 118-2, and a vertical surface 119-2. As can be seen in FIG. 1, first surface 116-2, second surface 117-2, and third surface 118-2 are parallel to each other.

As can be seen in FIG. 1, first surface 111 of metal pad 110 covers a portion (specifically the middle portion) of second surface 107 of substrate 105. Similarly, first surface 116-1 of dielectric layer 115-1 covers a portion (specifically an end portion) of second surface 107 of substrate 105. Similarly, first surface 116-2 of dielectric layer 115-2 covers a portion (specifically an end portion) of second surface 107 of substrate 105. Second surface 117-1 of dielectric layer 115-1 covers a portion (specifically a first end portion) of second surface 112 of medal pad 110. Similarly, second surface 117-2 of dielectric layer 115-2 covers a portion (specifically a second end portion) of second surface 112 of metal pad 110. Metal structure 120 covers a middle portion of second surface 112 of metal pad 110. More specifically, metal structure 120 covers the portion of second surface 112 not covered by dielectric layer 115-1 or 115-2. Additionally, metal structure 120 covers an end portion of third surface 118-1 of dielectric layer 115-1 and an end portion of third surface 118-2 of dielectric layer 115-2. In NSMD-like pad 100, third surface 118-1 is the farthest surface of dielectric layer 115-1 from metal pad 110 in the vertical direction. Similarly, third surface 118-2 is the farthest surface of dielectric layer 115-2 from metal pad 110 in the vertical direction. In the orientation of NSMD-like pad 100 shown in FIG. 1, third surfaces 118-1 and 118-2 may also be referred to as the lowest surface of dielectric layers 115-1 and 115-2, respectively. Furthermore, metal structure 120 covers vertical surface 119-1 of dielectric layer 115-1 that connects second surface 117-1 to third surface 118-1. Similarly, metal structure 120 covers vertical surface 119-2 of dielectric layer 115-2 that connects second surface 117-2 to third surface 118-2. A metal structure such as metal structure 120 may herein be referred to as a confirming metal disk. As such, metal structure 120 may also herein be referred to as confirming metal disk 120.

Metal structure 120 is not limited to being in the via between dielectric layers 115-1 and 115-2 since some portions of metal structure 120 are outside the via. For example, the portions of metal structure 120 covering third surfaces 118-1 and 118-2 are outside the via. As a result, dielectric layers 115-1 and 115-2 do not define the area of contact (in this case indirect contact) between solder ball 130 and metal pad 110. As such, NSMD-like pad 100 is referred to as an NSMD-like pad and not as an SMD pad. Nonetheless, NSMD-like pad 100 retains some of the benefits of an SMD pad, such as finer routing capability (due to the smaller size of metal pad 110) and avoidance of pad lifting since the metal pad 110 is partially covered by dielectric layers 115-1 and 115-2. Furthermore, NSMD-like pad 100 is an enlarged NSMD-like pad because the base of contact between solder ball 130 and metal structure 120 is greater than it would have been in the case of an SMD pad. The enlarged base area for the contact of solder ball 130 with metal structure 120 increases the ability of NSMD-like pad 100 to withstand stress and increases the adhesion between solder ball 130 and metal structure 120. It is to be noted that the via between dielectric layers 115-1 and 115-2 may be defined as the space between them (specifically horizontally between surfaces 119-1 and 119-2), but not extending vertically below third surfaces 118-1 and 118-2 in the orientation shown in FIG. 1. Alternatively, the via between dielectric layers 115-1 and 115-2 may be defined as the space between them (specifically horizontally between surfaces 119-1 and 119-2), but also extending vertically below third surfaces 118-1 and 118-2 in the orientation shown in FIG. 1. With either definition, metal structure 120 is outside the via.

Metal pad 110 may be made of any metal suitable for electrical conduction. In one embodiment, metal pad 110 is made of copper. Dielectric layers 115-1 and 115-2 may be made of any material suitable for electrical isolation. In one embodiment, dielectric layers 115-1 and 115-2 are solder-mask layers. Metal structure 120 may be made of any metal suitable for electrical conduction. In one embodiment, metal structure 120 is also made of copper. Solder ball 130 is made of solder. In one embodiment, solder ball 130 is made of high-lead solder (e.g., 95 percent lead with 5 percent tin (i.e., 95Pb5Sn) by weight or 90 percent Pb with 10 percent Sn (90Pb10Sn) by weight, including approximately 95Pb5Sn by weight or approximately 90Pb10Sn by weight, or any combination of mixtures between the two mixtures above in terms of Pb and Sn concentration).

The inclusion of metal structure 120 disposed between metal pad 110 and solder ball 130 greatly improves SJR. It is estimated that this improvement falls in the range of 50 to 100%. Without metal structure 120, solder ball 130 would fill the volume otherwise occupied by metal structure 120 and be directly in contact metal pad 110. Additionally, without metal structure 120, high stress points would exist where metal pad 110, dielectric layer 115-1 or 115-2, and solder ball 130 would meet. Furthermore, without metal structure 120, the stand-off height of solder ball 130 would be reduced (assuming the same volume of solder is used for solder ball 130) since volume that is occupied by metal structure 120 would be occupied by solder ball 130 and because the base area for placement of solder ball 130 would be smaller. The stand-off height is defined as the vertical distance (or height) from the bottom of the dielectric layer to the bottom of the solder ball. In NSMD-like pad 100, the stand-off height of solder ball 130 would be the vertical distance from the bottom of dielectric layer 115-1 or 115-2 (i.e., third surface 118-1 or 118-2) to the bottom of solder ball 130 (i.e., point 131). With metal structure 120 included, the stand-off height is increased, the high stress points are removed or replaced by lower stress points, the base area for the placement of solder ball 130 is increased, and solder ball 130 does not directly interface with metal pad 110. It is to be noted that larger base area and increased stand-off height improve SJR.

Figure 2:
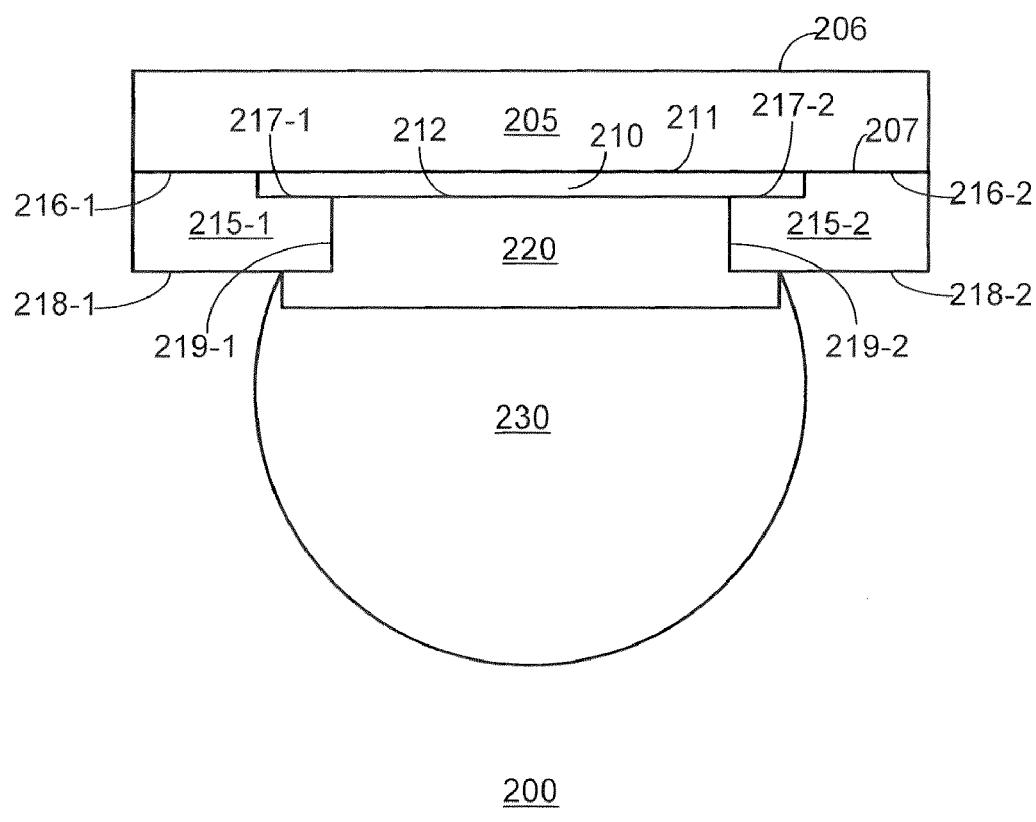
FIG. 2 shows a cross-sectional view of a second embodiment of an NSMD-like pad of the present invention.

FIG. 2 shows a cross-sectional view of a second embodiment of an NSMD-like pad of the present invention. In FIG. 2, NSMD-like pad 200 includes substrate layer 205, metal pad 210, dielectric layers 215-1 and 215-2, metal structure 220, and solder ball 230. Substrate layer 205 has a first surface 206 and a second surface 207. Similarly, metal pad 210 has first surface 211 and a second surface 212. Dielectric layer 215-1 has a first surface 216-1, a second surface 217-1, a third surface 218-1, and a vertical surface 219-1. Similarly, dielectric layer 215-2 has a first surface 216-2, a second surface 217-2, a third surface 218-2, and a vertical surface 219-2.

With the exceptions noted below, NSMD-like pad 200 is similar to NSMD-like pad 100. Components in NSMD-like pad 200 that serve similar functions as their counterparts in NSMD-like pad 100 have been designated with reference numbers that differ from those of their counterparts by one hundred. For example, solder ball 230 and metal pad 210 in NSMD-like pad 200 respectively correspond to solder ball 130 and metal pad 110 in NSMD-like pad 100. As NSMD-like pad 200 is similar to NSMD-like pad 100, it will not be described in greater detail here, except to note some of its differences relative to NSMD-like pad 100.

One of the main differences between NSMD-like pads 200 and 100 is in their metal structures 220 and 120. Whereas metal structure 120 is a conforming metal disk, metal structure 220 is a flat metal disk. This is because the bottom surface of metal structure 220 is flat. Flat metal disk is herein used for a metal structure such as metal structure 220 shown in FIG. 2. As such, metal structure 220 may also herein be referred to as flat metal disk 220. The bottom surface of metal structure 220 is the surface in contact with solder ball 230. Another main difference between NSMD-like pads 200 and 100 is that the stand-off height of solder ball 230 is greater than that of solder ball 130 assuming solder balls 230 and 130 have the same volume. This is because metal structure 220 fills more volume than metal structure 120. Finally, due to the flatness of the bottom surface of metal structure 220, it has less surface area contact with solder ball 230 than metal structure 120 has with solder ball 130. In other words, the base area of contact between solder ball 230 and metal structure 220 is smaller than the base area of contact between solder ball 130 and metal structure 120.

Figure 3:
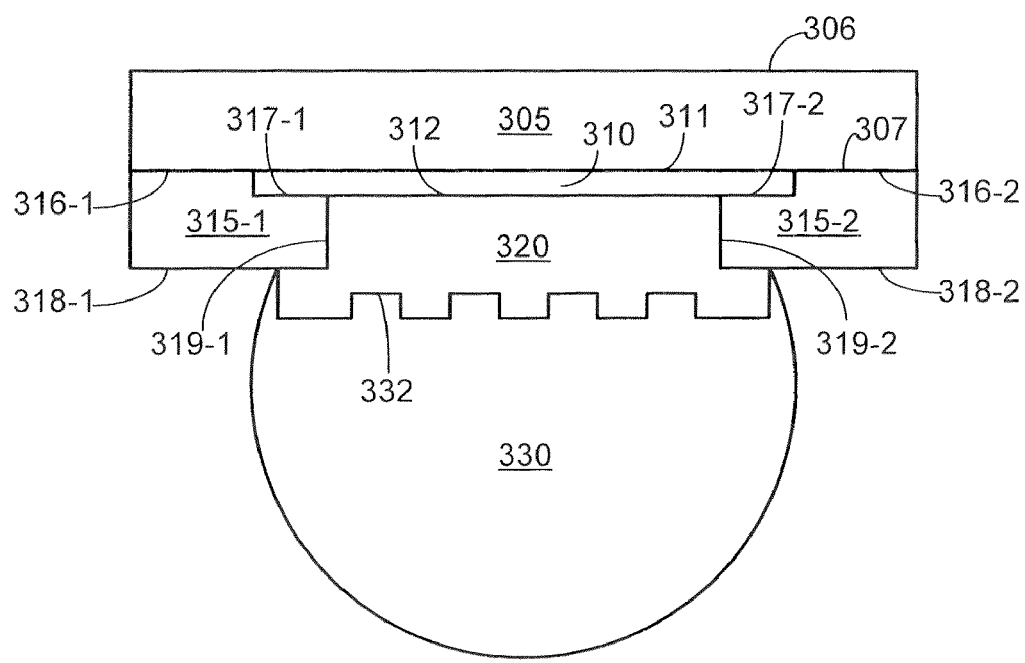
FIG. 3 shows a cross-sectional view of a third embodiment of an NSMD-like pad of the present invention.

FIG. 3 shows a cross-sectional view of a third embodiment of an NSMD-like pad of the present invention. In FIG. 3, NSMD-like pad 300 includes substrate layer 305, metal pad 310, dielectric layers 315-1 and 315-2, metal structure 320, and solder ball 330. Substrate layer 305 has a first surface 306 and a second surface 307. Similarly, metal pad 310 has a first surface 311 and a second surface 312. Dielectric layer 315-1 has a first surface 316-1, a second surface 317-1, a third surface 318-1, and a vertical surface 319-1. Similarly, dielectric layer 315-2 has a first surface 316-2, a second surface 317-2, a third surface 318-2, and a vertical surface 319-2.

With the exceptions noted below, NSMD-like pad 300 is similar to NSMD-like pad 100. Components in NSMD-like pad 300 that serve similar functions as their counterparts in NSMD-like pad 300 have been designated with reference numbers that differ from those of their counterparts by two hundred. For example, solder ball 330 and metal pad 310 in NSMD-like pad 300 respectively correspond to solder ball 130 and metal pad 110 in NSMD-like pad 100. As NSMD-like pad 300 is similar to NSMD-like pad 100, it will not be described in greater detail here, except to note some of its differences relative to NSMD-like pad 100.

One of the main differences between NSMD-like pads 300 and 100 is in their metal structures 320 and 120. Whereas metal structure 120 is a conforming metal disk, metal structure 320 is a meshed metal disk. This is because the bottom surface of metal structure 320 has a meshed form. Meshed metal disk is herein used for a metal structure (such as metal structure 320 shown in FIG. 3) whose bottom surface has a meshed form. As such, metal structure 320 may also herein be referred to as meshed metal disk 320. In one embodiment of the meshed form, grooves of the mesh (such as groove 332 shown in FIG. 3) run in the direction perpendicular to that of the surface (i.e., plane) defined by the cross section shown in FIG. 3. In another embodiment of the meshed form, grooves of the mesh run in the direction parallel to that of the surface (i.e., plane) defined by the cross section shown in FIG. 3, i.e., the grooves run in a direction perpendicular to groove 332. In yet another embodiment of the meshed form, grooves run in both of the directions above. As used herein, all of these alternatives are considered meshed forms. The bottom surface of metal structure 320 is the surface in contact with solder ball 330. Another main difference between NSMD-like pads 300 and 100 is that the stand-off height of solder ball 330 is greater than that of solder ball 130 assuming solder balls 330 and 130 have the same volume. This is because metal structure 320 fills more volume than metal structure 120. Finally, due to the meshed bottom surface of metal structure 320, it has greater surface area contact with solder ball 330 than metal structure 120 has with solder ball 130. In other words, the base area of contact between solder ball 330 and metal structure 320 is larger than the base area of contact between solder ball 130 and metal structure 120.

Figure 4:
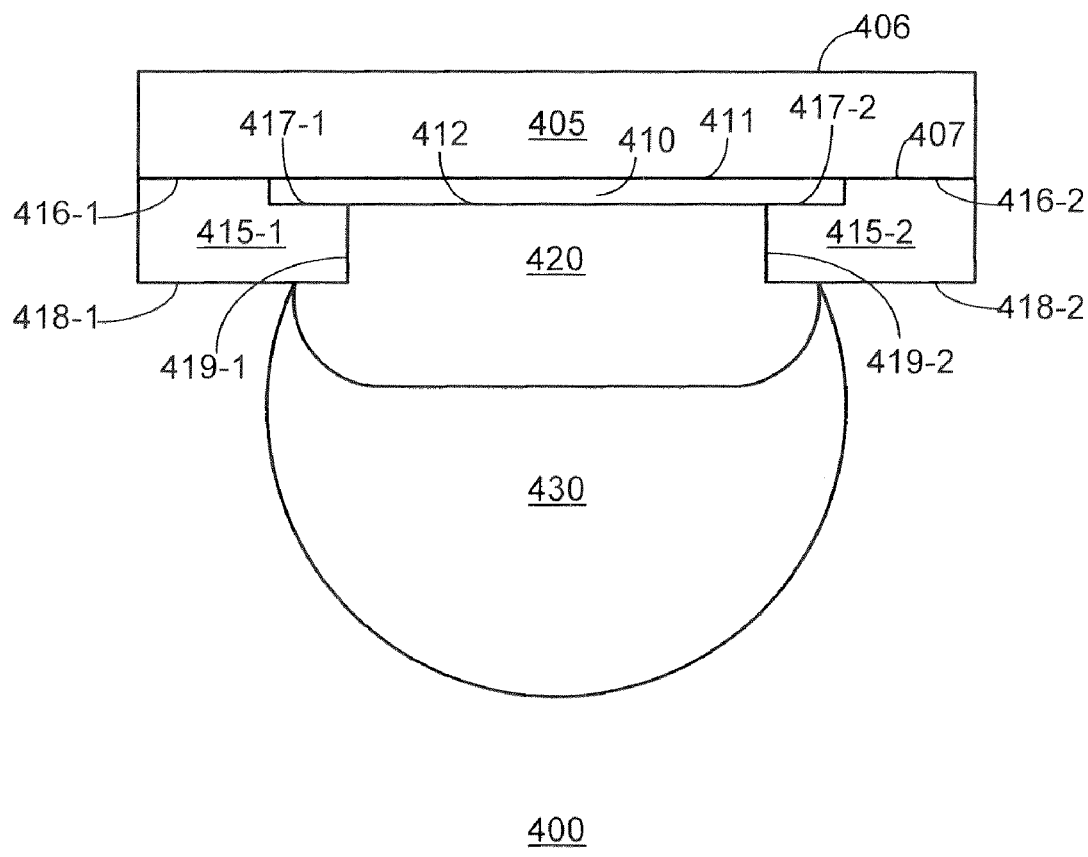
FIG. 4 shows a cross-sectional view of a fourth embodiment of an NSMD-like pad of the present invention.

FIG. 4 shows a cross-sectional view of a fourth embodiment of an NSMD-like pad of the present invention. In FIG. 4, NSMD-like pad 400 includes substrate layer 405, metal pad 410, dielectric layers 415-1 and 415-2, metal structure 420, and solder ball 430. Substrate layer 405 has a first surface 406 and a second surface 407. Similarly, metal pad 410 has a first surface 411 and a second surface 412. Dielectric layer 415-1 has a first surface 416-1, a second surface 417-1, a third surface 418-1, and a vertical surface 419-1. Similarly, dielectric layer 415-2 has a first surface 416-2, a second surface 417-2, a third surface 418-2, and a vertical surface 419-2.

With the exceptions noted below, NSMD-like pad 400 is similar to NSMD-like pad 100. Components in NSMD-like pad 400 that serve similar functions as their counterparts in NSMD-like pad 100 have been designated with reference numbers that differ from those of their counterparts by three hundred. For example, solder ball 430 and metal pad 410 in NSMD-like pad 400 respectively correspond to solder ball 130 and metal pad 110 in NSMD-like pad 100. As NSMD-like pad 400 is similar to NSMD-like pad 100, it will not be described in greater detail here, except to note some of its differences relative to NSMD-like pad 100.

One of the main differences between NSMD-like pads 400 and 100 is in their metal structures 420 and 120. Whereas metal structure 120 is a conforming metal disk, metal structure 420 is a pre-solder disk. It is to be noted that the bottom surface of metal structure 420 has the form of a curved disk. The bottom surface of metal structure 420 is the surface in contact with solder ball 430. Additionally, in one embodiment, metal structure 420 is made of a high-Pb solder (e.g., 95Pb5Sn (including approximately 95Pb5Sn), 90Pb10Sn (including approximately 90Pb10Sn), or any combination of mixtures between the two mixtures above in terms of Ph and Sn concentration). Pre-solder disk is herein used for a metal structure such as metal structure 420 shown in FIG. 4 made of solder or high-Pb solder (e.g., 95Pb5Sn (including approximately 95Pb5Sn), 90Pb10Sn (including approximately 90Pb10Sn), or any combination of mixtures between the two mixtures above in terms of Pb and Sn concentration). As such, metal structure 420 may also herein be referred to as pre-solder disk 420. Another main difference between NSMD-like pads 400 and 100 is that the stand-off height of solder ball 430 is greater than that of solder ball 130 assuming solder balls 430 and 130 have the same volume. This is because metal structure 420 fills more volume than metal structure 120. Finally, metal structure 420 has less surface area contact with solder ball 430 than metal structure 120 has with solder ball 130. In other words, the base area of contact between solder ball 430 and metal structure 420 is smaller than the base area of contact between solder ball 130 and metal structure 120.

The metal structures in NSMD-like pads 100-400 may be formed using any technique known in the art or hereafter developed that is appropriate for the particular metal structure form and material. In one embodiment, metal structures 110, 210, and 310 may be formed by plating Cu in the respective NSMD-like pad. In one embodiment, metal structure 410 may be formed by plating high-lead solder (e.g., 95Pb5Sn (including approximately 95Pb5Sn), 90Pb10Sn (including approximately 90Pb10Sn), or any combination of mixtures between the two mixtures above in terms of Pb and Sn concentration) in NSMD-like pad 400.

Figure 5:
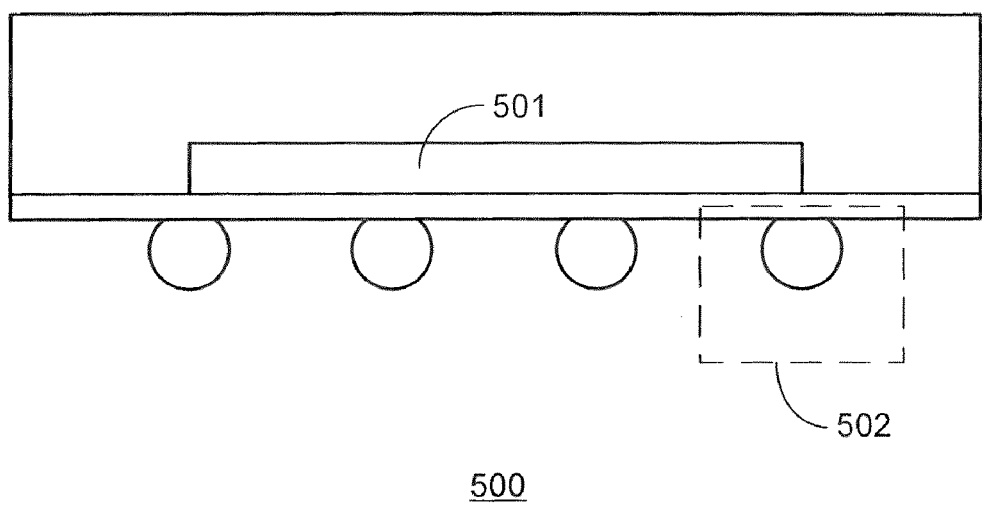
FIG. 5 is a block diagram of an embodiment of the IC package of the present invention.

FIG. 5 is a block diagram of an embodiment of the IC package of the present invention. In FIG. 5, IC package 500 includes an IC chip 501 and many NSMD-like pads of the present invention (of which one is referenced as NSMD-like pad 502). NSMD-like pad 502 may be any of the NSMD-like pads 100 to 400 of the present invention. In FIG. 5, IC package 500 is shown as including four NSMD-like pads for convenience, but those skilled in the art would realize that there are typically many more than four such pads in an IC package. Also, other components and details of the IC package are not shown in FIG. 5 to avoid overcomplicating the drawing and because such components and features are well known in the art or are shown in detail in FIGS. 1 to 4. It is to be noted that, in one embodiment, IC chip 501 is a field programmable gate array (FPGA) chip. It is also to be noted that IC package 500 may be a flip-chip BGA package or a wire-bond BGA package.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An integrated circuit (IC) package comprising:
   a metal pad having a first metal pad surface and a second metal pad surface substantially parallel to the first metal pad surface;
   a first dielectric layer having a first surface, a second surface, and a third surface, wherein the first dielectric layer covers a first end portion of the second metal pad surface, and the third surface of the first dielectric layer is substantially parallel to the first and second surfaces of the first dielectric layer;
   a second dielectric layer having a first surface, a second surface, and a third surface, wherein the second dielectric layer covers a second end portion of the second metal pad surface, and the third surface of the second dielectric layer is substantially parallel to the first and second surfaces of the second dielectric layer; and a metal structure covering a middle portion of the second metal pad surface, a first end portion of the third surface of the first dielectric layer, and a first end portion of the third surface of the second dielectric layer, wherein the metal structure comprises a flat metal disk or a pre-solder disk, wherein the pre-solder disk is a curved disk and comprises solder.

2. The IC package of claim 1 further comprising:
a substrate layer having a first substrate layer surface and a second substrate layer surface, wherein the metal pad covers a portion of the second substrate layer surface, the first dielectric layer covers a first portion of the second substrate layer surface, and the second dielectric layer covers a second portion of the second substrate layer surface.

3. The IC package of claim 1, wherein the metal structure comprises the flat metal disk.

4. The IC package of claim 1, wherein the flat metal disk comprises copper (Cu).

5. The IC package of claim 1 further comprising:
a solder ball covering the metal structure.

6. The IC package of claim 1, wherein the IC package is a ball grid array (BGA) package that includes a field programmable gate array (FPGA).

7. The IC package of claim 1, wherein the metal structure comprises the pre-solder disk.

8. The IC package of claim 7, wherein the pre-solder disk has a lead (Pb) concentration of approximately 90 to 95 percent by weight and a tin (Sn) concentration of approximately 10 to 5 percent by weight.

9. An integrated circuit (IC) package comprising:
a substrate layer having a first substrate layer surface and a second substrate layer surface;
a metal pad having a first metal pad surface and a second metal pad surface substantially parallel to the first metal pad surface, wherein the first metal pad surface covers a portion of the second substrate layer surface;
a first dielectric layer having a first surface, a second surface, and a third surface, wherein the first surface of the first dielectric layer covers a first portion of the second substrate layer surface, a second surface of the first dielectric layer covers a first end portion of the second metal pad surface, and the third surface of the first dielectric layer is substantially parallel to the first and second surfaces of the first dielectric layer;
a second dielectric layer having a first surface, a second surface, and a third surface, wherein the first surface of the second dielectric layer covers a second portion of the second substrate layer surface, a second surface of the second dielectric layer covers a second end portion of the second metal pad surface, and the third surface of the second dielectric layer is substantially parallel to the first and second surfaces of the second dielectric layer; and
a metal structure covering a middle portion of the second metal pad surface, a first end portion of the third surface of the first dielectric layer, and a first end portion of the third surface of the second dielectric layer, wherein the metal structure comprises a flat metal disk or a pre-solder disk, wherein the pre-solder disk is a curved disk and comprises solder.

10. The IC package of claim 9 further comprising a solder ball covering the metal structure.

11. The IC package of claim 9, wherein the IC package is a ball grid array (BGA) package that includes a field programmable gate array (FPGA).

12. The IC package of claim 9, wherein the metal structure comprises the flat metal disk.

13. The IC package of claim 12, wherein the flat metal disk comprises copper (Cu).

14. The IC package of claim 9, wherein the metal structure comprises the pre-solder disk.

15. The IC package of claim 14, wherein the pre-solder disk has a lead (Pb) concentration of approximately 90 to 95 percent by weight and a tin (Sn) concentration of approximately 10 to 5 percent by weight.

16. An integrated circuit (IC) package comprising:
a substrate layer having a first substrate layer surface and a second substrate layer surface;
a metal pad having a first metal pad surface and a second metal pad surface substantially parallel to the first metal pad surface, wherein the first metal pad surface covers a portion of the second substrate layer surface;
a first dielectric layer having a first surface, a second surface, and a third surface, wherein the first surface of the first dielectric layer covers a first portion of the second substrate layer surface, a second surface of the first dielectric layer covers a first end portion of the second metal pad surface, and the third surface of the first dielectric layer is substantially parallel to the first and second surfaces of the first dielectric layer;
a second dielectric layer having a first surface, a second surface, and a third surface, wherein the first surface of the second dielectric layer covers a second portion of the second substrate layer surface, a second surface of the second dielectric layer covers a second end portion of the second metal pad surface, and the third surface of the second dielectric layer is substantially parallel to the first and second surfaces of the second dielectric layer;
a metal structure covering a middle portion of the second metal pad surface, a first end portion of the third surface of the first dielectric layer, and a first end portion of the third surface of the second dielectric layer, wherein the metal structure comprises a flat metal disk or a pre-solder disk, wherein the metal structure comprises copper (Cu), further wherein the pre-solder disk is a curved disk and has a lead (Pb) concentration of approximately 90 to 95 percent by weight and a tin (Sn) concentration of approximately 10 to 5 percent by weight; and
a solder ball covering the metal structure.

17. The IC package of claim 16, wherein the IC package is a ball grid array (BGA) package that includes a field programmable gate array (FPGA).

* * * * *